US010224181B2

(12) United States Patent
Biloiu et al.

(10) Patent No.: US 10,224,181 B2
(45) Date of Patent: Mar. 5, 2019

(54) RADIO FREQUENCY EXTRACTION SYSTEM FOR CHARGE NEUTRALIZED ION BEAM

(71) Applicant: Varian Semiconductor Equipment Associates, Inc., Gloucester, MA (US)

(72) Inventors: Costel Biloiu, Rockport, MA (US); Piotr Lubicki, Peabody, MA (US); Tyler Rockwell, Wakefield, MA (US); Christopher Campbell, Newburyport, MA (US); Vikram Singh, North Andover, MA (US); Kevin M. Daniels, Lynnfield, MA (US); Richard J. Hertel, Boxford, MA (US); Peter F. Kurunczi, Cambridge, MA (US); Alexandre Likhanskii, Malden, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 282 days.

(21) Appl. No.: 15/133,261

(22) Filed: Apr. 20, 2016

(65) Prior Publication Data

US 2017/0309453 A1    Oct. 26, 2017

(51) Int. Cl.
*H01J 37/32* (2006.01)
(52) U.S. Cl.
CPC ...... *H01J 37/32082* (2013.01); *H01J 37/321* (2013.01); *H01J 37/3244* (2013.01); *H01J 37/32412* (2013.01); *H01J 37/32422* (2013.01)

(58) Field of Classification Search
CPC .................................................. H01J 37/32082
See application file for complete search history.

(56) References Cited

U.S. PATENT DOCUMENTS

| 6,478,924 B1 * | 11/2002 | Shamouilian ..... H01J 37/32706 118/723 I |
| 9,230,773 B1 | 1/2016 | Likhanskii et al. |
| 2008/0067430 A1 | 3/2008 | Hershkowitz et al. |

(Continued)

FOREIGN PATENT DOCUMENTS

WO    2015159208 A1    10/2015

OTHER PUBLICATIONS

Ankur Agarwal, et al., Effect of simultaneous source and bias pulsing in inductively coupled plasma etching, Journal of Applied Physics, 2009, pp. 103305-1 to 103305-12, vol. 106, American Institute of Physics.

(Continued)

*Primary Examiner* — Joseph A Miller, Jr.

(57) ABSTRACT

A processing apparatus may include a plasma chamber to house a plasma and having a main body portion comprising an electrical insulator; an extraction plate disposed along an extraction side of the plasma chamber, the extraction plate being electrically conductive and having an extraction aperture; a substrate stage disposed outside of the plasma chamber and adjacent the extraction aperture, the substrate stage being at ground potential; and an RF generator electrically coupled to the extraction plate, the RF generator establishing a positive dc self-bias voltage at the extraction plate with respect to ground potential when the plasma is present in the plasma chamber.

13 Claims, 9 Drawing Sheets

(56) References Cited

U.S. PATENT DOCUMENTS

| | | | |
|---|---|---|---|
| 2008/0132046 A1* | 6/2008 | Walther | H01J 37/08 438/513 |
| 2010/0330300 A1* | 12/2010 | Stowell | H01J 37/32192 427/575 |
| 2012/0104274 A1* | 5/2012 | Hirayanagi | B82Y 10/00 250/424 |
| 2015/0008213 A1 | 1/2015 | Miller et al. | |
| 2015/0101634 A1 | 4/2015 | Leavitt et al. | |
| 2015/0123006 A1 | 5/2015 | Sinclair et al. | |

OTHER PUBLICATIONS

Samer Banna, et al., Inductively coupled pulsed plasmas in the presence of synchronous pulsed substrate bias for robust, reliable, and fine conductor etching, IEEE Transactions on Plasma Science, Sep. 2009, pp. 1730-1746, vol. 37, No. 9, IEEE.

K. Kohler, et al., Plasma potentials of 13.56-MHz rf argon glow discharges in a planar system, Journal of Applied Physics, Jan. 1985, pp. 59 to 66, vol. 57, No. 1, American Institute of Physics.

D. Rafalskyi, et al., Coincient ion acceleration and electron extraction for space propulsion using the self-bias formed on a set of RF biased grids bounding a plasma source, Journal of Physics D: Applied Physics, 2014, p. 1 to 9, vol. 47, IOP Publishing.

International Search Report and Written Opinion dated Aug. 3, 2017 for PCT/US2017/028372.

\* cited by examiner

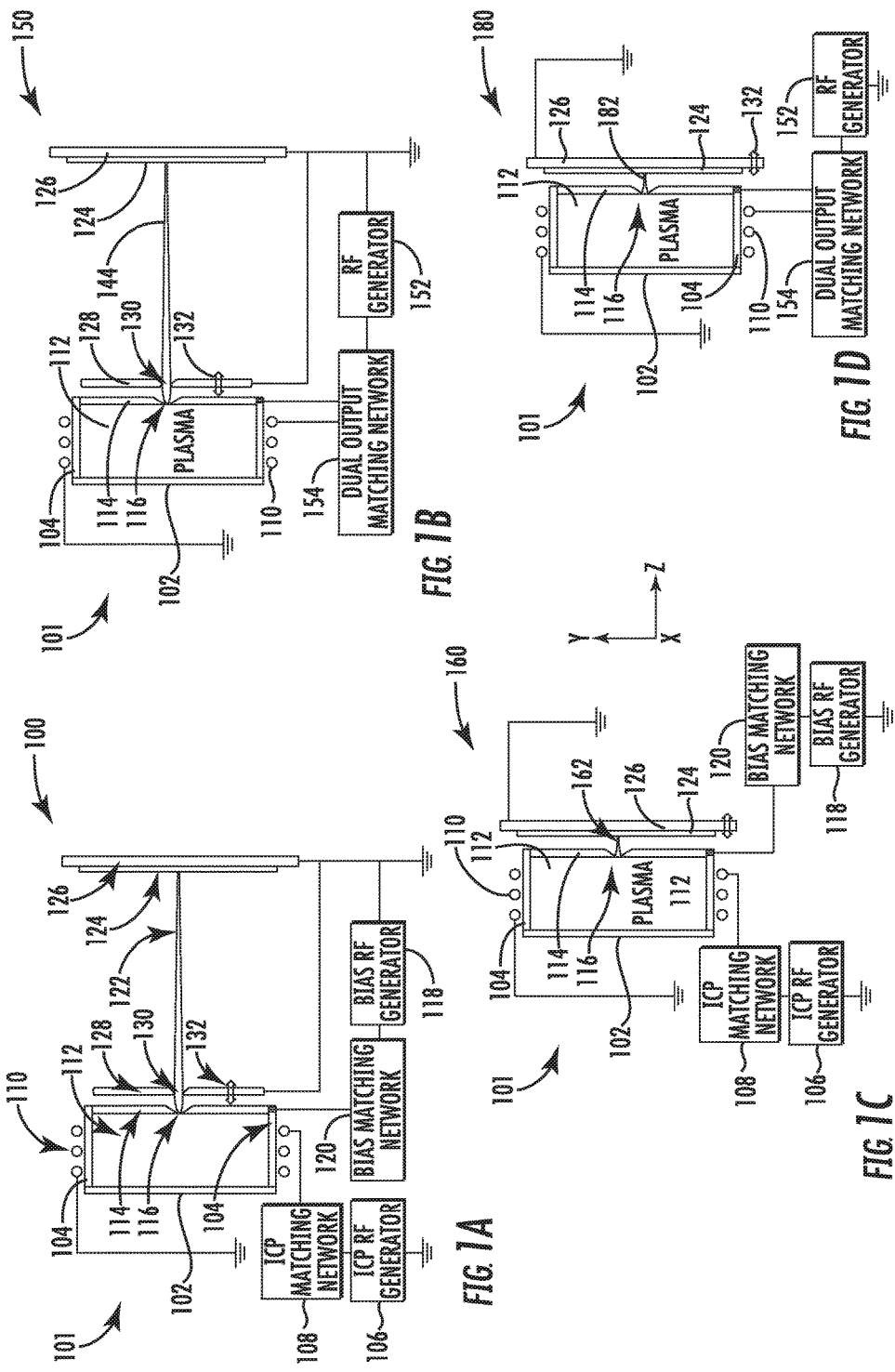

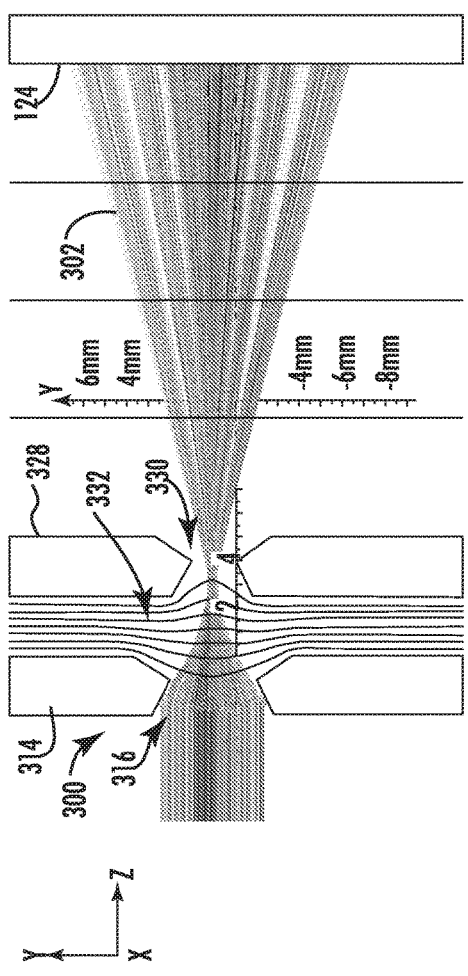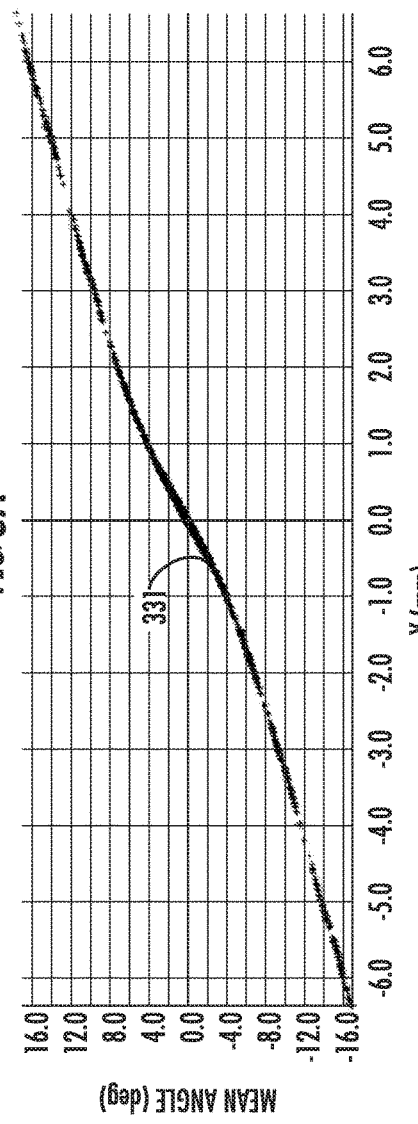
FIG. 3A
FIG. 3B

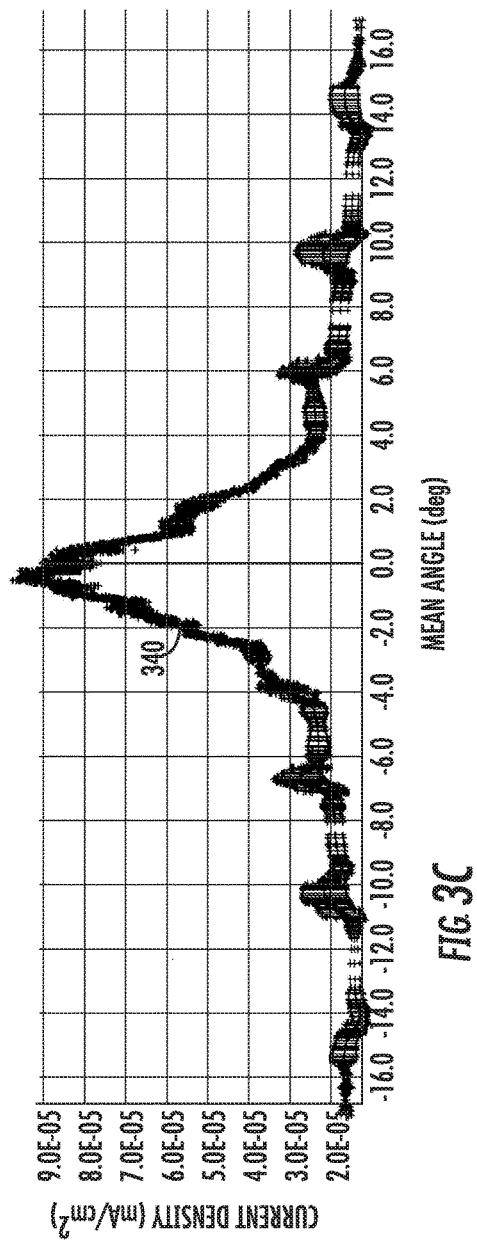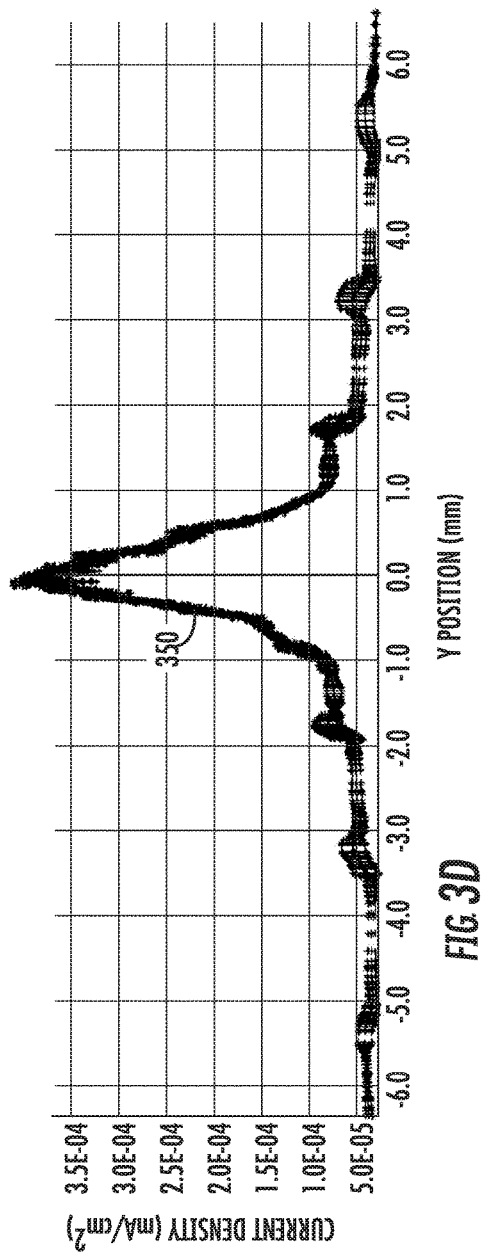
FIG. 3C
FIG. 3D

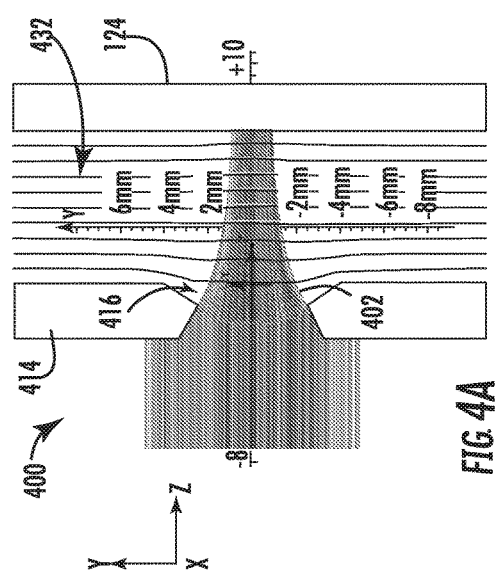
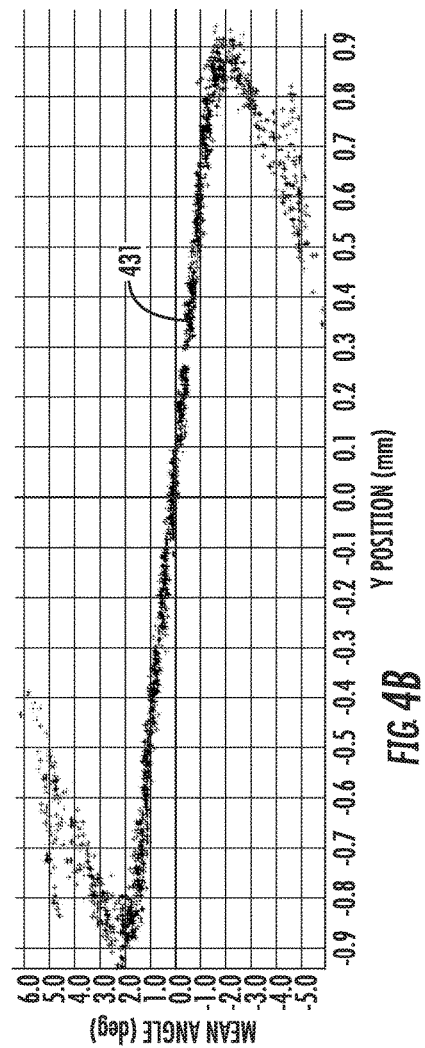
FIG. 4A
FIG. 4B

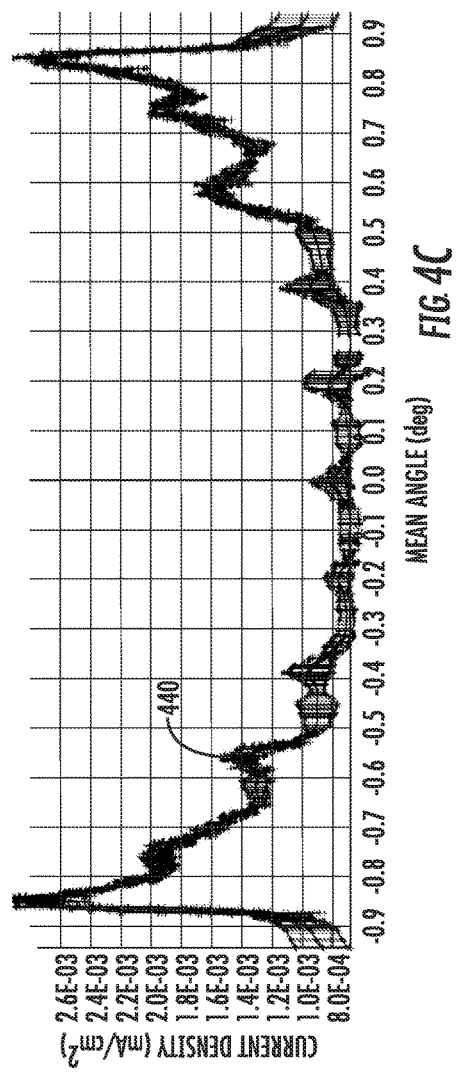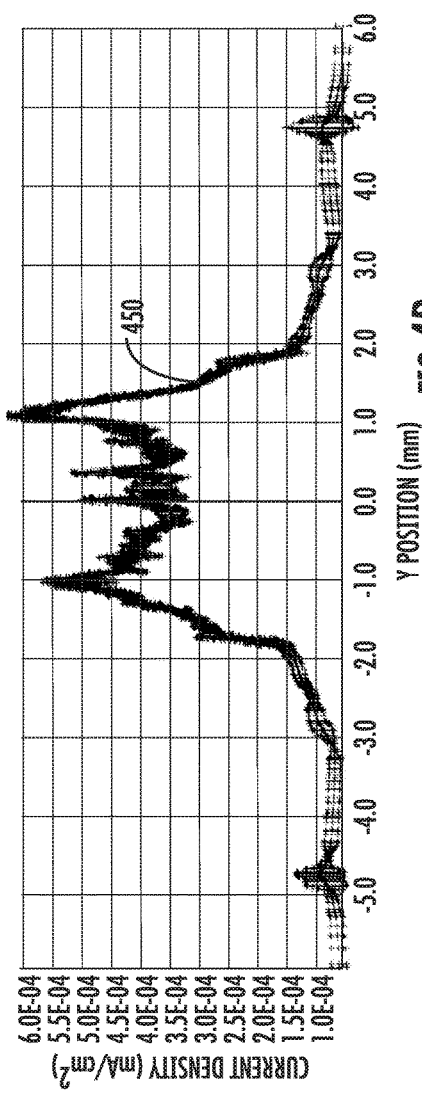
FIG. 4C
FIG. 4D

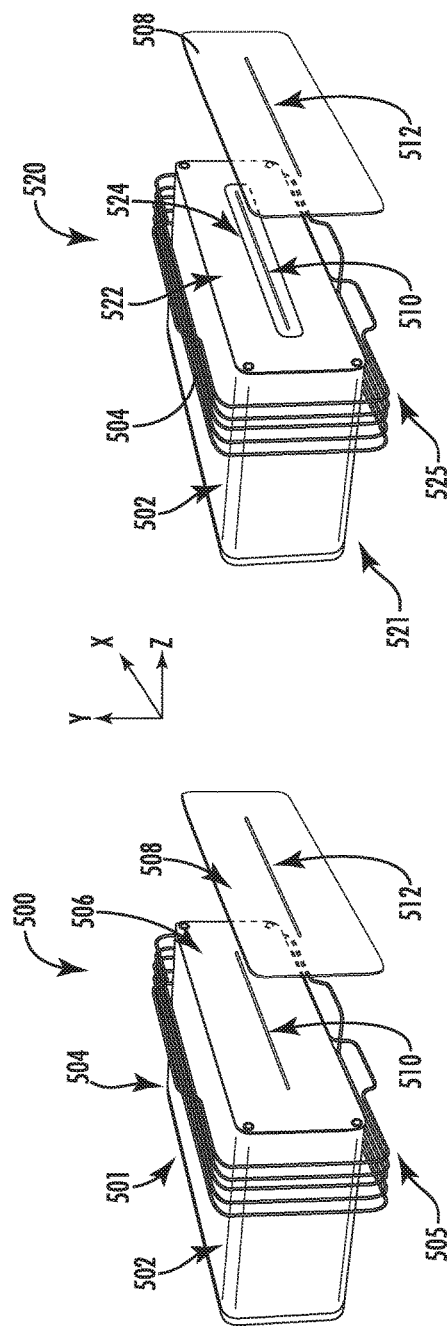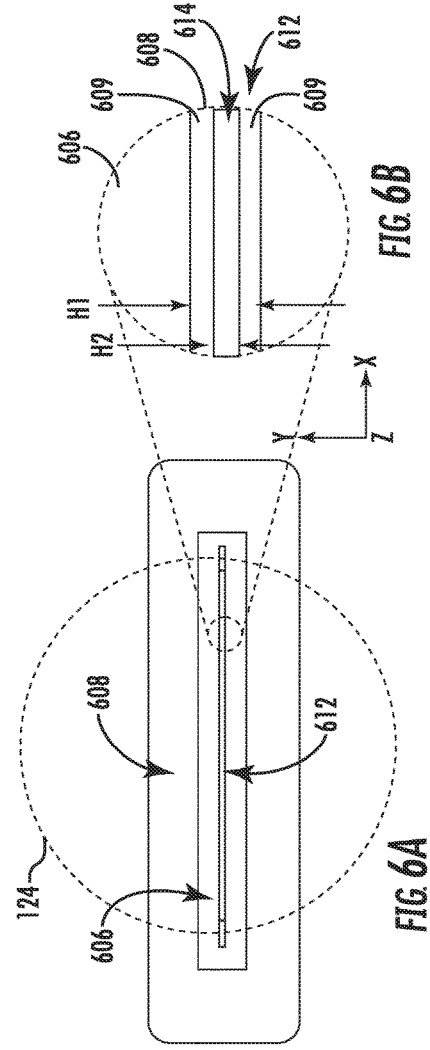

RADIO FREQUENCY EXTRACTION SYSTEM FOR CHARGE NEUTRALIZED ION BEAM

FIELD

The present embodiments relate to a processing apparatus, and more particularly, to providing charge neutralized ion beams.

BACKGROUND

Conventional apparatus used to treat substrates with ions include beamline ion implanters and plasma immersion ion implantation tools. Both are appropriate for implanting ions over a range of energies. In beamline ion implanters ions are extracted from a source, mass analyzed and then transported to the substrate surface. In plasma immersion ion implantation apparatus, a substrate is located in the same chamber the plasma is generated adjacent to the plasma. The substrate is set at negative potential with respect to the plasma and ions that cross the plasma sheath in front of the substrate impinge on the substrate at zero incidence angle with respect to a perpendicular to a surface of the substrate.

Recently, a new type of processing apparatus has been developed allowing the generation of an ion beam such as a ribbon beam in a compact system. In this apparatus ions are extracted from a plasma chamber, while unlike the beamline ion implanters where the substrate is located remotely from the ion source, the substrate is located proximate the plasma chamber. Ions are extracted through an aperture of special geometry located in an extraction plate that is placed proximate a plasma. The ions may be extracted as a ribbon beam made of positive ions by biasing the plasma chamber with a dc potential positively with respect to a substrate. While a substrate may be grounded, positive charge may build up on a substrate from bombardment with positive ions and secondary electron emission. Accordingly, in known systems a pulsed DC voltage may be applied to allow neutralization of a substrate during a pulse "OFF" period. For some substrates such as semiconductor structures having an arrangement including oxide layers, the positive charge accumulated on the substrate surface may not be fully neutralized even for high pulsing frequency and/or low duty cycle operation. Consequently, when ions are directed to the substrate for etching or other substrate processing, non-uniform etch patterns may occur across a substrate surface, and damage of the semiconductor structures may occur, resulting in poor processing yield.

With respect to these and other considerations the present embodiments are provided.

SUMMARY

In one embodiment, a processing apparatus includes a plasma chamber to house a plasma and having a main body portion comprising an electrical insulator; an extraction plate disposed along an extraction side of the plasma chamber, the extraction plate being electrically conductive and having an extraction aperture; a substrate stage disposed outside of the plasma chamber and adjacent the extraction aperture, the substrate stage being at ground potential; and an RF generator electrically coupled to the extraction plate, the RF generator establishing a positive dc self-bias voltage at the extraction plate with respect to ground potential when the plasma is present in the plasma chamber.

In a further embodiment, a method of processing a substrate may include providing a plasma chamber having a main body portion comprising an electrical insulator; generating a plasma in the plasma chamber; providing an extraction plate along an extraction side of the plasma chamber, the extraction plate being electrically conductive and having an extraction aperture; arranging a substrate stage holding a substrate outside of the plasma chamber and adjacent the extraction aperture, the substrate stage being at ground potential; and generating an RF voltage at the extraction plate, wherein a positive dc self-bias voltage is established at the extraction plate with respect to ground potential when the plasma is present in the plasma chamber, wherein an ion beam having an ion energy proportional to the dc self-bias voltage is directed to the substrate.

In an additional embodiment a processing apparatus may include a plasma chamber having a main body portion comprising an electrical insulator; a first RF generator electrically coupled to the plasma chamber to generate a plasma therein; an extraction plate disposed along an extraction side of the plasma chamber, the extraction plate being electrically conductive and having an extraction aperture; a substrate stage disposed outside of the plasma chamber and adjacent the extraction aperture, the substrate stage being at ground potential; a ground plate disposed between the extraction plate and substrate stage, the ground plate comprising an electrically conductive material and being coupled to ground potential, the ground plate further comprising a ground plate aperture; and a second RF generator electrically coupled to the extraction plate, the second RF generator establishing a positive dc self-bias voltage at the extraction plate with respect to ground potential when the plasma is present in the plasma chamber.

BRIEF DESCRIPTION OF THE DRAWINGS

FIGS. 1A-1D depict variants of processing apparatus according to different embodiments of this disclosure;

FIG. 3A depicts the geometry of an extraction system and simulation results for ion beam extraction in accordance with an embodiment of the disclosure;

FIG. 3B depicts simulation of ion beam emissivity as a function of position consistent with the extraction geometry of FIG. 3A;

FIG. 3C depicts simulation of ion angular distribution of an ion beam consistent with the extraction geometry of FIG. 3A;

FIG. 3D depicts simulation of ion beam current profile of an ion beam consistent with the extraction geometry of FIG. 3A;

FIG. 4A provides a perspective view and beam modelling results of an apparatus according to another embodiment of the disclosure;

FIG. 4B provides a modelling results of the beam emissivity curve consistent with the extraction geometry of FIG. 4A;

FIG. 4C depicts simulation of ion angular distribution of the ion beam consistent with the extraction geometry of FIG. 4A;

FIG. 4D depicts simulation of ion beam current profile of the ion beam consistent with the extraction geometry of FIG. 4A;

FIG. 5A provides a perspective view of an apparatus according to another embodiment of the disclosure;

FIG. 5B provides a perspective view of a further apparatus according to an additional embodiment of the disclosure;

FIG. 6A and FIG. 6B show details of extraction geometry for an extraction plate and ground plate according to various embodiments of the disclosure.

DETAILED DESCRIPTION

Figure 2A:
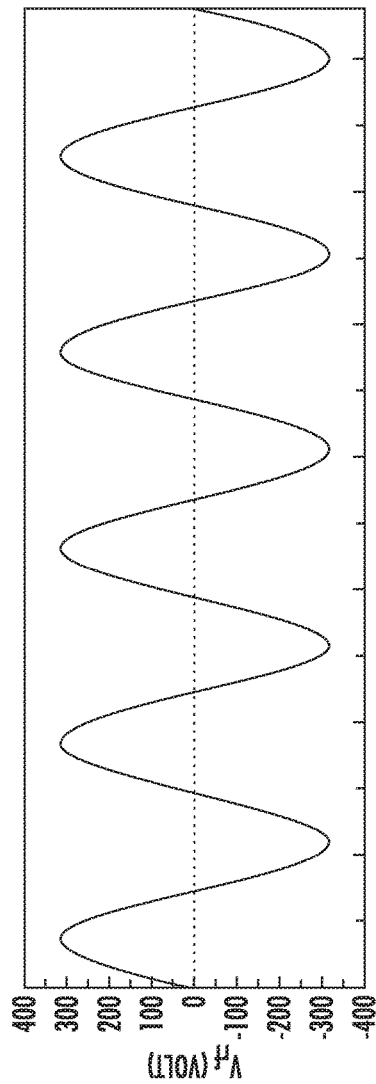
FIG. 2A and FIG. 2B shown exemplary voltage waveforms illustrating principles of operation related to the present embodiments.

The embodiments described herein provide apparatus and methods for providing a charge neutralized ion beam for processing a substrate in a compact apparatus. In particular, various embodiments may employ radio frequency (RF) voltage for biasing extraction optics electrodes having apertures for charged particle extraction. Various techniques and apparatus of the present embodiments may harness the phenomenon of dc self-bias generation occurring when RF biased conductive surfaces having an asymmetry in surface area are brought in contact with a plasma. Because of the self-bias generation, positive ions may be extracted continuously while electrons are extracted intermittently during short bursts within an RF cycle. As detailed below, because an RF period is much shorter (70 nsec for 13.56 MHz) than the period used in known pulsed dc systems (20 μsec for a maximum attainable pulsing frequency of 50 kHz), the apparatus arranged according to the present embodiments may generate little or no buildup of positive charge at a substrate being processed.

In particular embodiments employing RF voltage extraction, a processing apparatus may be simplified in comparison to known compact ion beam apparatus. For example, using the ion beam extraction architecture disclosed herein an insulation transformer may be eliminated because a plasma chamber acting as an ion source may be electrically floating or at ground potential, while a substrate is held at ground potential. Additionally, an expensive pulsed dc power supply may be replaced with known RF generator and matching network, or with a single RF generator and a dual output matching network while preserving capabilities of pulsed dc extraction systems, including tunability in ion beam energy, beam current, and other ion beam properties.

FIGS. 1A-1D depict variants of processing apparatus according to different embodiments of this disclosure. Turning to FIG. 1A, there is shown an apparatus 100 including an ion source 101 based upon a plasma chamber 102. Ion source 101 may be an RF plasma source, inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. In this particular embodiment depicted in FIG. 1A, the ion source 101 is an ICP source including an ICP RF generator 106, and an ICP RF matching network 108. The transfer of RF power from the RF generator to the gas atoms and/or molecules takes places through an antenna 110 and a dielectric window, where the dielectric window forms a main body portion 104 of the plasma chamber 102. A gas manifold (not shown) may be connected to the plasma chamber 102 through appropriate gas lines, mass flow regulators and gas inlets. The ion source 101 or other components of the apparatus 100 also may be connected to a vacuum system (not shown), such as a turbo molecular pump backed by a rotary or membrane pump.

In the embodiment of FIG. 1A, the plasma chamber 102 includes a main body portion 104 made of an electrical insulator. The main body portion 104 may include, for example, walls of the plasma chamber 102 as shown. The plasma chamber 102 further includes an extraction plate 114, where the extraction plate is electrically conductive. The extraction plate 114 includes an extraction aperture 116. The apparatus 100 further includes a bias RF generator 118 coupled to the extraction plate 114, via a bias matching network 120. The matching network contains a tuning capacitor in series with the RF output line, where the turning capacitor, besides adjusting the impedance seen by the RF generator, has the role of blocking the dc component of the electric current flowing through the RF plasma system. As detailed below, in operation the bias RF generator establishes a positive dc-self bias voltage at the extraction plate 114 when a plasma 112 is present in the plasma chamber 102.

The apparatus 100 further includes a ground plate 128 disposed between the extraction plate 114 and a substrate stage 126, where the substrate stage is disposed outside the plasma chamber 102, such as in a separate chamber (not explicitly shown). The ground plate 128 may comprise an electrically conductive material and is coupled to ground potential as shown in FIG. 1A. The ground plate further includes a ground plate aperture 130, where the extraction aperture 116 and ground plate aperture 130 are arranged to provide a line of sight between the plasma 112 and substrate stage 126 as suggested in FIG. 1A.

In brief, the positive dc-self bias voltage generated by the bias RF generator 118 has the effect of generating an ion beam 122 (composed of positive ions) and directing the ion beam 122 to a substrate 124 held by the substrate stage 126. At the same time, and as detailed below, the RF voltage generated at the extraction plate 114 may create short bursts of electrons extracted from the plasma 112 and also directed to the substrate 124. This provision of electrons to substrate 124 may serve to provide charge neutralization so excessive positive charge does not develop on the substrate 124. While not explicitly shown, the substrate stage may be movable along the Y-axis, so an entirety of a substrate 124 may be exposed to the ion beam 122, as well as to neutralizing electrons as the substrate 124 is scanned.

Figure 2B:
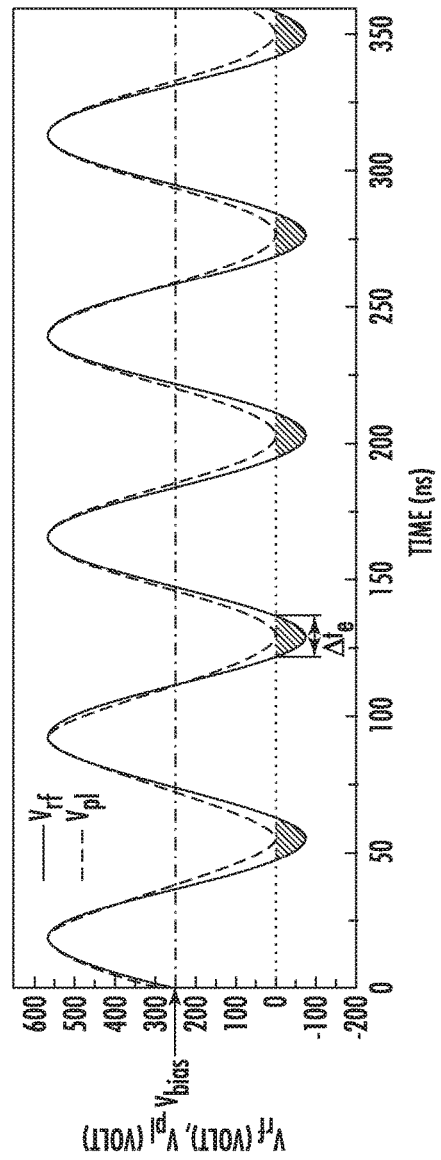

Turning now to FIG. 2A and FIG. 2B there are shown exemplary voltage waveforms illustrating principles of operation related to the present embodiments. In various embodiments, the phenomenon of dc-self bias generation when an RF signal is applied to an asymmetric electrode configuration is exploited. According to various embodiments of the disclosure, the arrangement of extraction plate 114 and ground plate 128 provides an asymmetric electrode configuration where rf biased conductive asymmetric surface areas are brought in contact with the plasma 112. For example, and as detailed below with respect to FIG. 4B, the extraction plate 114 may present a larger surface area to the plasma that the ground plate 128. When RF power is applied on the extraction plate 114, because of large difference between the surface areas of the powered electrode (extraction plate 114) $A_{PWR}$ and the grounded electrode $A_{GND}$ (the area of ground plate "seen" by the plasma 112) a positive dc self-bias develops at the powered electrode. This phenomenon is illustrated in FIG. 2A and FIG. 2B, where FIG. 2A and FIG. 2B present the RF voltage ($V_{rf}$) wave forms on the extraction plate 114 in the case where no plasma is present and the case where plasma is present, respectively, and $V_{pl}$ is the wave form of the plasma potential. While no dc bias is present without a plasma and the electrostatic potential polarity exhibits a waveform having a positive portion and a negative portion alternating symmetrically about 0V, when plasma is present a positive dc bias (Vbias) develops on the powered electrode, extraction plate 114, and the extraction plate 114 is at positive potential for a relatively longer time during one cycle. Consequently, the plasma potential (dashed sinusoidal line in FIG. 2A) adjust itself, reaching zero value at the instant when RF voltage on the extraction plate 114 reaches a minimum value. In the example shown, the peak-to-peak amplitude of the RF voltage signal is 600 V, and the RF frequency is 13.5 MHz. When a plasma is present in this example, a positive dc self-bias of 250 V results, as shown in FIG. 2B. Furthermore, to ensure proper operation, the RF frequency is properly chosen: not too high to allow plasma sheath to form but not too low to lead to a very broad ion distribution or surface charging effects.

This development of positive dc self-bias may be explained as follows. When an RF signal is applied to an extraction electrode, there is no net dc current due to the presence of a tuning capacitor in the bias matching network 120, as a consequence of the charge neutrality condition. As a result, the voltage drops on sheaths in front of the powered electrode (extraction plate 114) and the ground electrode (ground plate 128) self-adjusts so that no net charge is accumulated during one cycle on either of electrodes. When plasma is present, the plasma can see the ground electrode, ground plate 128, just through the extraction aperture 116 in the extraction plate 114. This may effectively establish a large surface area ratio of powered electrode to ground electrode ($A_{PWR}/A_{GND}$). For example, the extraction plate 114 may have dimensions of many centimeters on each side, providing a surface area of tens or hundreds of square centimeters. The surface area of the ground plate 128 that effectively acts as a ground electrode to the plasma 112 may be just the area of the ground plate 128 exposed to the plasma 112 through the extraction aperture 116. As detailed below, this area may be somewhat less than the area of the extraction aperture 116. In various embodiments the extraction aperture 116 may have dimensions of tens of centimeters along the X-axis of the Cartesian coordinate system shown, while having dimensions of several millimeters along the Y-axis, yielding a total area of 10 cm², for example. Accordingly, when the area of the ground plate 128 is several hundred cm², the ratio of $A_{PWR}/A_{GND}$ may be greater than 10/1. Accordingly, most of the RF voltage drops on the sheath in front of the ground plate 128; hence, positive ions may be extracted continuously having a mean energy equal to the dc self-bias, while electrons may be extracted in bursts during temporal intervals when the plasma sheath collapses, i.e., the RF voltage on the extraction plate is negative. In order to allow ion extraction the height of the extraction aperture may properly be on the order of the plasma sheath thickness $$s = \frac{\sqrt{2}}{3}\lambda_D \left(\frac{2V_{rf}}{T_e}\right)^{3/4} \quad (1)$$

where Te stands for electron temperature and $\lambda_D$ for electron Debye length.

As detailed in FIG. 2B, for a given RF period of approximately 74 ns, during a short interval or burst shown as $\Delta t_e$, electrons may be extracted from plasma 112 when $V_{rf}$ is negative. In this example, the duration of $\Delta t_e$ may be approximately 10-12 ns, while this duration may be tuned by changing experimental conditions including RF power delivered to the plasma, gas pressure, RF frequency, $A_{PWR}/A_{GND}$, and other parameters. Notably, ions may continue to be extracted during the intervals $\Delta t_e$ since the ions, such as argon ions or other processing ions, do not respond to the RF signal and "see" just the $V_{bias}$ as a continuous positive dc bias. In other words, ions are too massive to follow the alternation of RF field polarity at the frequencies employed by the present embodiments, so the ions are extracted as the ion beam 122 having a mean energy equal to the dc self-bias voltage. Moreover, because of the frequency of the RF signal, the interval between bursts of electrons is merely ~70 ns in this example, insufficient time for large amount of positive charge to build up on a substrate 124 and cause damage.

Figure 2D:
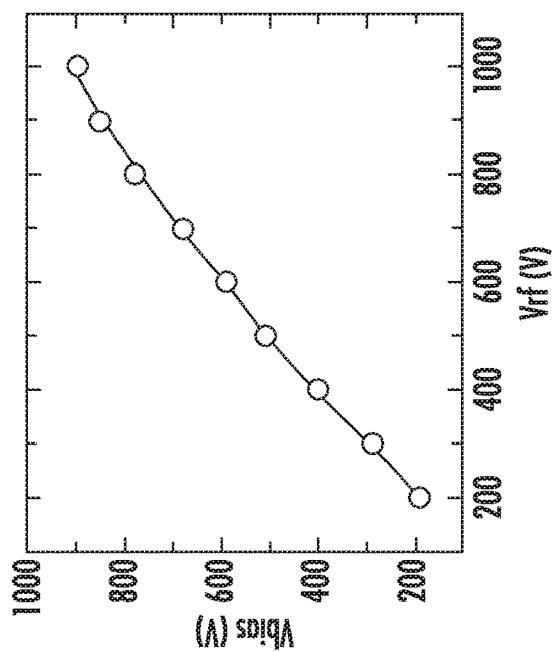
FIG. 2D shows variation of dc self-bias voltage with RF voltage.
Figure 2C:
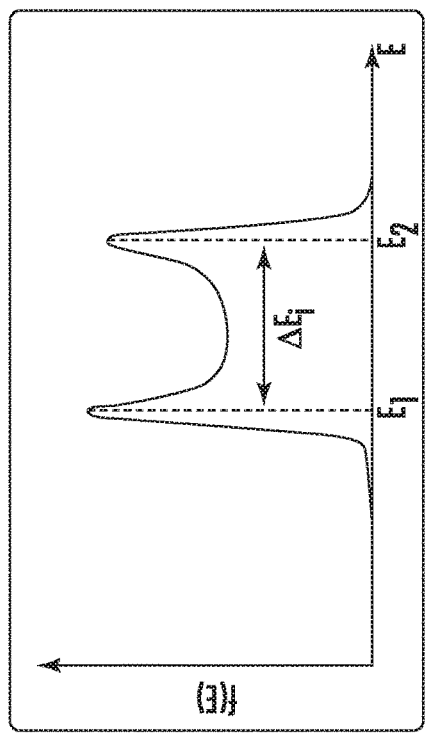
FIG. 2C shows an ion energy distribution function (iedf) generated by application of an RF voltage to an extraction plate.

Notably, as shown in FIG. 2C, the ion energy distribution function (iedf) generated by application of an RF voltage to the extraction plate 114 is not monoenergetic. As shown in FIG. 2C the ion energy exhibits an energy spread, where the energy spread is proportional to the ratio of RF period to the ion transit time through the plasma sheath. Accordingly, higher RF frequency yields a narrower iedf. Depending on the particular RF configuration, for commonly used RF frequencies of 2 MHz to 60 MHz, the width of the iedf may be as low as few tens of eV. This range of ion energy may be acceptable for processing applications such as etching of a substrate or deposition of ions to form a film or coating. The embodiments are not limited in this context.

Moreover, the ion beam energy of the ion beam 132 may be tuned by varying the dc self-bias voltage $V_{bias}$. Generally, $V_{bias}$ is approximatively a linear function of $V_{rf}$ as shown in FIG. 2D. In particular, the relation between the two voltages may be expressed as $V_{bias}=[(1-a)/(1+a)]V_{rf}$ where a is an asymmetry factor, including the surface area ratio of powered electrode to ground electrode. Because factor "a" can take values between 0 and 1, the result is $V_{bias}$ value is equal to $V_{rf}$ when a is zero and $V_{bias}=0$ when a=1. The mean energy may be varied by adjusting the RF voltage, and accordingly the applied RF power on the extraction plate 115. Beam current in turn may be adjusted by modifying the amount of power delivered to antenna 110.

To ensure proper operation, the ground plate 128 may be arranged within a target distance of the extraction plate 114, such as within 1 cm or less along the Z-axis. This distance may be adjustable along the direction 132 as shown. When the ground plate is located within the target distance, this allows the ground plate 128 to act as the second electrode in an asymmetric electrode configuration as described above. As further shown in FIG. 1A the apparatus 100 provides the ability to adjust the distance along the Z-axis between a plane of the extraction plate 114 and the substrate stage 126. Because the substrate 124 does not act as a second electrode, the substrate 124 may be located more remotely from the plasma chamber 102, such as at a distance of 1 cm or more along the Z-axis if desired.

FIG. 3A depicts details of the geometry of an extraction system 300 in accordance with an embodiment of the disclosure. The extraction system 300 may include an extraction plate 314 and ground plate 328, where the operation is similar to the operation described with respect to extraction plate 114 and ground plate 328. FIG. 3A also depicts the results of simulation of ion beam extraction for an ion beam 302 for a specific set of conditions. Modelling results of FIG. 3A also illustrate the ion beam shape and equipotential lines 330 under conditions of 600 V dc self-bias. For this geometry the extraction plate 314 has an extraction aperture 316 having a height along the Y-axis of 4 mm, while the ground plate 328 has a ground plate aperture 331 having a height along the Y-axis of 2 mm.

FIG. 3B depicts simulation of ion beam emissivity 331 as a function of position at the substrate plane, consistent with the extraction geometry of FIG. 3A. As shown the ion beam 302 is a slightly divergent beam of ~4 degree/mm that spans ~12 mm along Y-axis at the substrate (wafer) 124.

FIG. 3C depicts simulation of ion angular distribution of the ion beam 302 consistent with the extraction geometry of FIG. 3A. As shown, ion angular distribution 340 of the extracted ion beam, where the mean angle is =0 deg, has an ion angular distribution or angular spread of ~4 degrees.

FIG. 3D depicts simulation of ion beam current profile of the ion beam 302 consistent with the extraction geometry of FIG. 3A. As shown, the beam current profile 350 illustrates ~90% of the beam current falls in a range of ~4 mm along Y-axis.

Notably, the exact beam current profile and area of the substrate 124 impacted by the ion beam 302 may be varied by varying the position of the substrate 124. By virtue of using a ground plate in the embodiments illustrated generally in FIG. 1A and FIG. 3A, the ability to locate the substrate 124 remotely with respect to an extraction plate provides an additional advantage. In particular, the amount of the material etched from the substrate 124 from an ion beam and traveling into a plasma chamber may be reduced substantially with respect to known systems where a substrate may be located nearer to an extraction plate. For example, the amount of etched material may scale as the inverse of the square of the distance along the Z direction between substrate and extraction so if the distance is doubled then the etched material traveling back into a plasma chamber is reduced four times.

In various embodiments, the separation between an extraction plate and ground plate along the Z-axis may be made as small as possible, with the limitation being imposed by the Paschen breakdown condition for the local pd product (pressure times separation gap length). If pressure conditions are maintained in the range of several mTorr or so, then as small as 1-2 mm separation between an extraction plate and ground plate may be employed for voltages not exceeding 2-3 kV, for example. For similar range of pressure and voltage, regarding an upper range of separation of extraction plate and ground plate, the separation may be no more than 9-10 mm because in such a case plasma cannot "feel" the ground electrode when a larger separation is maintained since the separation may exceed the plasma sheath thickness). Notably, these limits are a function of plasma density and the RF voltage: higher voltage and/or low plasma density act in favor of a larger separation because of a resulting larger plasma sheath thickness. As an example, for extraction voltages of a couple of kV and plasma densities in the range of $5 \times 10^9$-$10^{11}$ cm$^{-3}$ a separation up to a maximum of 10 mm between extraction plate and ground plate may still allow the ground plate and extraction plate to function as an asymmetrical electrode configuration generating a dc self-bias voltage, as shown above with respect to FIG. 2B or FIG. 2D. As a rule of thumb, the separation between extraction plate and ground plate along the Z-axis may be equal to the extraction aperture height along the Y-direction. As regards location of a substrate outside of the ground plate, increasing the separation between substrate and extraction plate does not affect electrostatic potential distribution. Accordingly, the substrate may be placed further away from an extraction plate so as to reduce back-sputtering of material from the substrate through an extraction aperture and into a plasma chamber. As to an upper limit of separation of substrate and extraction plate the footprint of an ion beam on a substrate increases with separation for a given beam divergence. Accordingly, to limit the beam spread to a portion of a substrate surface at a given instance, a smaller separation between substrate and extraction plate may be useful. In the example of FIG. 3A, the substrate 124 can be placed at z=25 mm from the extraction plate 314 and still have a reasonably small beam footprint (~30 mm along the Y-axis for a fully neutralized beam).

FIG. 1B depicts another apparatus 150 according to further embodiments of the disclosure. The apparatus 150 may function similarly to apparatus 100, except as noted below. In this variant, instead of having two separate RF generators, just one RF generator is provided, shown as the RF generator 152, reducing the number of RF generators and matching networks. In addition, a dual output matching network 154 is provided where the dual output matching network 154 is coupled to the RF generator 152, to the extraction plate 114, and to an RF antenna (antenna 110) adjacent the plasma chamber 102. In this manner the RF generator 152 functions to generate the plasma 112 in the plasma chamber 102 and to generate a dc self-bias at the extraction plate 114 as described above.

Turning now to FIG. 1C, there is shown an additional apparatus, apparatus 160, according to other embodiments of the disclosure. The apparatus 160 may generally include the same components as described above with respect to apparatus 100, except the apparatus 160 may omit the ground plate 128. Instead, in this embodiment, the substrate 124 may act as the ground electrode in an asymmetric electrode configuration. In this configuration, the area of the ground electrode may be equivalent to the area of the extraction aperture 116 because the extraction aperture 116 serves to define the area of the ground plate 128 seen by the plasma 112. Additionally, the substrate stage 126 may be arranged closer to the extraction plate 114 than in the configuration of FIG. 1A, since the substrate 124 is to act as the ground electrode for the plasma 112.

Turning now to FIG. 1D, there is shown an additional apparatus, apparatus 180, according to further embodiments of the disclosure. The apparatus 180 may generally include the same components as described above with respect to apparatus 150, except the apparatus 180 may omit the ground plate 128, so the substrate 124 acts as ground electrode as described with respect to FIG. 1C.

FIG. 4A depicts details of the geometry of an extraction system 400 in accordance with an embodiment of the disclosure. The extraction system 400 may include an extraction plate 414, where the operation is similar to the operation described with respect to extraction plate 114. FIG. 4A also depicts the results of simulation of ion beam extraction for an ion beam 402 for a specific set of conditions. Modelling results of FIG. 4A also illustrate the ion beam shape and equipotential lines 330 under conditions of 2 kV dc self-bias. For this geometry the extraction plate 414 has an extraction aperture 416 having a height along the Y-axis of 4 mm, while the substrate 124 is located at a position Z=7 mm with respect to the extraction plate 414 along the Z-axis. In this simulation, the substrate 124 forms a part of the extraction optics, where the substrate 124 acts as a ground electrode in an asymmetric electrode configuration as discussed above.

FIG. 4B depicts simulation of ion beam emissivity 431 as a function of position at the substrate plane, consistent with the extraction geometry of FIG. 4A. As shown the ion beam 402 is a slightly convergent beam of ~−2 degree/mm that spans ~2 mm along Y-axis at the substrate (wafer) 124.

FIG. 4C depicts simulation of ion angular distribution of the ion beam 402 consistent with the extraction geometry of FIG. 4A. As shown, ion angular distribution 440 of the extracted ion beam, where the mean angle is =0 deg, has an ion angular distribution or angular spread of ~2 degrees.

FIG. 4D depicts simulation of ion beam current profile of the ion beam 402 consistent with the extraction geometry of FIG. 4A. As shown, the beam current profile 450 illustrates ~95% of the beam current falls in a range of ~6 mm along Y-axis.

FIG. 5A provides a perspective view of an apparatus 500 according to another embodiment of the disclosure. The apparatus 500 may include other components such as RF generator(s) and matching network(s) as described above. The apparatus 500 includes a plasma chamber 501 including dielectric wall 502, where the dielectric wall 502 may be made from alumina, quartz, aluminum nitride or other insulator material. An antenna 504 is disposed around the plasma chamber 501 to drive an inductively coupled plasma within the plasma chamber 501. The apparatus 500 includes an extraction plate 506 disposed along a side of the plasma chamber 501. The extraction plate 506 may be made from an electrically conductive material and coupled to an RF generator as generally described above with respect to FIGS. 1A-1D. In this embodiment, the extraction plate 506 may occupy an entire portion of the extraction side 505 of the plasma chamber 501. As further shown in FIG. 5A, the extraction plate 506 may include an extraction aperture 510 constituting a first elongated aperture having a first long axis, where the first long axis lies along the X-axis. The apparatus 500 may further include a ground plate 508 having a ground plate aperture 512, where the ground plate aperture 512 constitutes a second elongated aperture having a second long axis aligned parallel to the first long axis. In this manner, ions may be extracted as a ribbon beam from the plasma chamber 501, and may continue to propagate as a ribbon beam through the ground plate 508.

FIG. 5B provides a perspective view of another apparatus 520 according to an additional embodiment of the disclosure. The apparatus 520 may have similar components to the apparatus 500 except as noted. The apparatus 520 may include a plasma chamber 521 similar to plasma chamber 501, save for the extraction side. In this example, the extraction side 525 of the plasma chamber 521 comprises an electrically non-conductive portion 522, such as a plate disposed around an extraction plate 524, where the extraction plate 524 is electrically conductive and operates generally as described in the aforementioned embodiments. This embodiment provides a plasma chamber 521 where a greater proportion of the plasma chamber walls are electrically non-conductive, resulting in reduced plasma losses to chamber walls and a higher plasma density for a given input power.

Turning now to FIG. 6A and FIG. 6B, there are shown details of extraction geometry for an extraction plate 606 and ground plate 608 according to various embodiments of the disclosure. The perspective shown in the figures is from the inside of a plasma chamber looking toward a substrate. The extraction plate 606 includes an extraction aperture 612 elongated along the X-axis as shown. In some embodiments, the extraction aperture 612 may span 30 cm, 40 cm, or more along the X-axis, sufficient to cover an entirety of substrate 124 of similar dimensions along the X-axis. Accordingly, when the substrate 124 is scanned along the Y-axis, the entirety of the substrate 124 may be exposed to species emitted through the extraction aperture 612. As particularly shown in FIG. 6B, the extraction aperture 612 may have first height H1 along a short axis (Y-axis) perpendicular to the first long axis (X-axis). In various embodiments, depending on the applied RF power to a plasma chamber the plasma sheath thickness may range from a few hundred micrometers to a few millimeters. Accordingly, the first height H1 may be arranged to be less than 5 millimeters for example. In addition, the ground plate aperture 614 is also an elongated aperture and comprises a second height H2 along the short axis less than the first height. For example, H1 may be 4 mm, while H2 is 1.5 mm. The embodiments are not limited in this context. As further indicated in FIG. 4B the ground plate aperture 614 may, but need not be, centered in the extraction aperture 612 as projected on the X-Y plane. This arrangement allows a line of sight from a plasma to substrate 124, and for an ion beam to propagate in a direction parallel to the Z-axis from the plasma to substrate 124.

Notably, in the geometry shown in FIG. 6B, the relative area of the asymmetric electrode configuration may be determined as follows. The extraction plate 606 may have a first area A1, while the extraction aperture 612 comprises a second area A2. As noted, the second area A2 may be much smaller than the area A1, such as less than 10% the area of A1. Additionally, the ground plate aperture may have a third area A3 smaller than the second area A2. According to various embodiments the effective area of the ground electrode is A2−A3. This calculation results because the plasma just sees the exposed area 609 of the ground plate 608, where this exposed area 609 is the area of the extraction aperture 612 projected on the plane of the ground plate 608, minus the open area defined by the ground plate aperture 614. In accordance with particular embodiments, the relative sizes of the extraction electrode, extraction aperture, and ground electrode aperture may be set so A1/(A2−A3) is 10 or greater.

Figure 7:
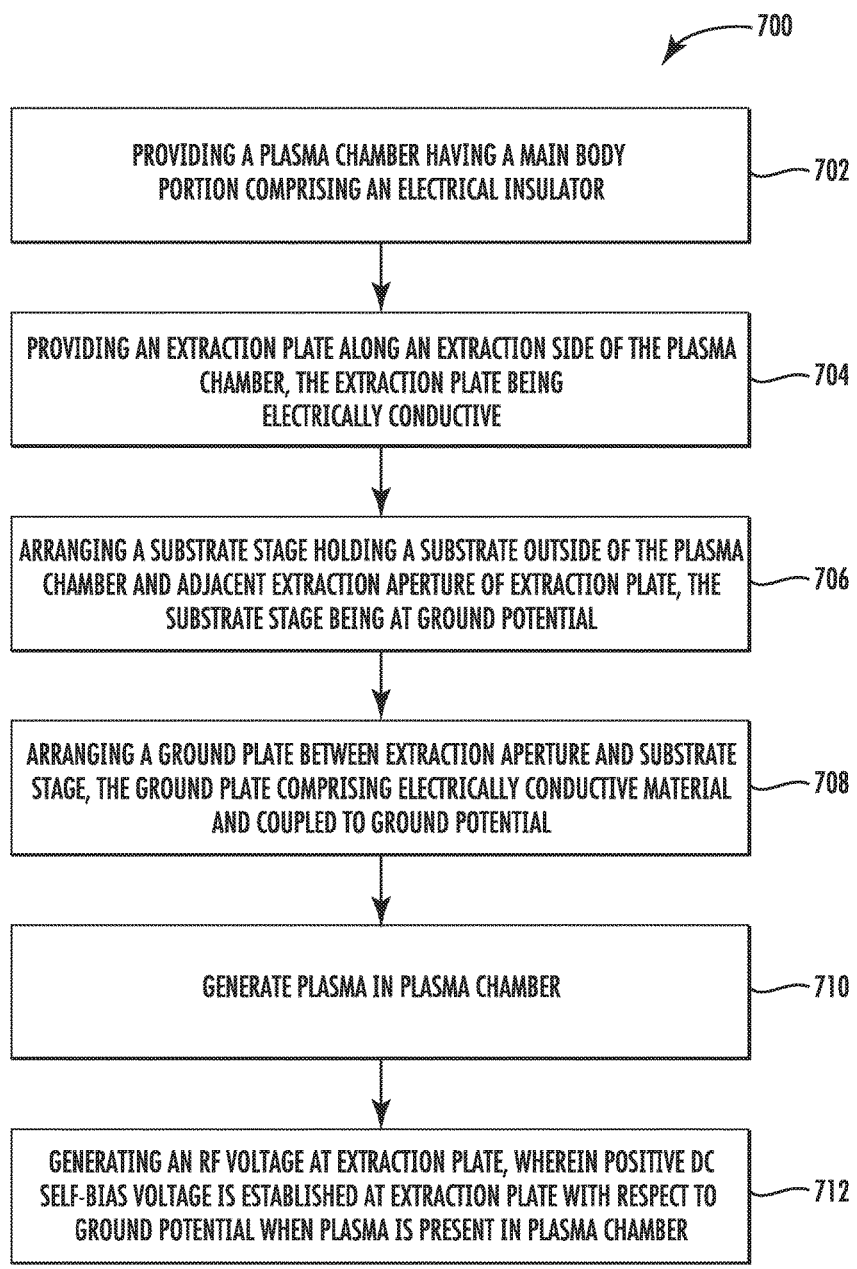
FIG. 7 depicts an exemplary process flow.

FIG. 7 depicts an exemplary process flow 700. At block 702 a plasma chamber is provided, where the plasma chamber includes a main body portion comprising an electrical insulator. The main body portion may cover a majority of the surface area of plasma chamber walls in some examples. At block 704 an extraction plate is provided along an extraction side of the plasma chamber is performed. The extraction plate may be electrically conductive and may extend over all or a portion of the extraction side in different embodiments. At block 706, a substrate stage holding a substrate is arranged outside of the plasma chamber and adjacent the extraction aperture of the extraction plate, where the substrate stage is at ground potential. The substrate stage may hold a substrate that is also held at ground potential. At block 708 a ground plate is arranged between the extraction aperture and the substrate stage, where the ground plate comprises an electrically conductive material and is coupled to ground potential. The ground plate may include a ground plate aperture that together with the extraction aperture provides line of sight between the plasma chamber and substrate. The ground plate may be arranged within a target distance of the extraction plate so as to act as a ground electrode in an asymmetric electrode configuration. At block 710, a plasma is generated in the plasma chamber. At block 712 an RF voltage is generated at the extraction plate, wherein a positive dc self-bias voltage is established at the extraction plate with respect to ground potential when the plasma is present in the plasma chamber.

The present embodiments provide multiple advantages including the ability to deliver an ion beam to a substrate in a compact processing apparatus without the need for an insulation transformer and the need to elevate a plasma chamber to high voltage. In addition, various embodiments allow an expensive pulsed dc power supply to be replaced an industry standard RF system. Other advantages include the ability to provide full neutralization to a substrate in a compact ion beam processing apparatus as compared to conventional pulsed dc processing apparatus.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing apparatus comprising:
a plasma chamber to house a plasma and having a main body portion comprising an electrical insulator;
an extraction plate disposed along an extraction side of the plasma chamber, the extraction plate being electrically conductive and having an extraction aperture;
a substrate stage disposed outside of the plasma chamber and adjacent the extraction aperture, the substrate stage being at ground potential; and
an RF generator electrically coupled to the extraction plate, the RF generator establishing a positive dc self-bias voltage at the extraction plate with respect to ground potential when the plasma is present in the plasma chamber, wherein the RF generator comprises a bias RF generator, the processing apparatus further comprising:
an RF antenna disposed adjacent the plasma chamber
an inductively coupled plasma (ICP) matching network directly coupled to the RF antenna;
an ICP RF generator coupled to the ICP matching network; and
a bias matching network electrically coupled between the bias RF generator and the extraction plate.

2. The processing apparatus of claim 1, further comprising:
a ground plate disposed between the extraction plate and substrate stage, the ground plate comprising an electrically conductive material and being coupled to ground potential, the ground plate further comprising a ground plate aperture, wherein the extraction aperture and ground plate aperture provide a line of sight between the plasma and substrate stage.

3. The processing apparatus of claim 2, wherein the extraction aperture comprises a first elongated aperture having a first long axis, wherein the ground plate aperture comprises a second elongated aperture having a second long axis aligned parallel to the first long axis, wherein the extraction aperture comprises a first height along a short axis perpendicular to the first long axis, and wherein the ground plate aperture comprises a second height along the short axis less than the first height.

4. The processing apparatus of claim 1, wherein the substrate stage defines a substrate plane lying parallel to the extraction plate, wherein a separation between the substrate plane and the extraction plate is less than 1 cm.

5. The processing apparatus of claim 2 wherein the ground plate defines a ground plane lying parallel to the extraction plate, wherein a separation between the ground plane and the extraction plate is less than 1 cm.

6. The processing apparatus of claim 5, wherein the substrate stage is movable along a direction perpendicular to the ground plane, wherein a second separation between the substrate stage and the extraction plane is greater than 1 cm.

7. The processing apparatus of claim 1, the RF generator comprising a circuit generating an RF voltage signal at the extraction plate having a frequency of 2 MHz to 60 MHz, the RF voltage signal comprising a waveform having a positive portion and a negative portion, wherein electrons are extracted through the extraction aperture and directed to the substrate stage during the negative portion.

8. A processing apparatus comprising:
a plasma chamber to house a plasma and having a main body portion comprising an electrical insulator;
an extraction plate disposed along an extraction side of the plasma chamber, the extraction plate being electrically conductive and having an extraction aperture;
a substrate stage disposed outside of the plasma chamber and adjacent the extraction aperture, the substrate stage being at ground potential;
an RF generator electrically coupled to the extraction plate, the RF generator establishing a positive dc self-bias voltage at the extraction plate with respect to ground potential when the plasma is present in the plasma chamber, and
a ground plate disposed between the extraction plate and substrate stage, the ground plate comprising an electrically conductive material and being coupled to ground potential, wherein the ground plate and extraction plate comprise an asymmetric electrode configuration where rf biased conductive asymmetric surfaces are brought in contact with the plasma,
the ground plate further comprising a ground plate aperture, wherein the extraction aperture and ground plate aperture provide a line of sight between the plasma and substrate stage, wherein the extraction plate comprises a first area A1, wherein the extraction aperture comprises a second area $A_2$, wherein the ground plate aperture comprises a third area $A_3$, wherein $A_1/(A_2-A_3)$ is 10 or greater.

9. The processing apparatus of claim 8, wherein the extraction aperture comprises a first elongated aperture having a first long axis, wherein the ground plate aperture comprises a second elongated aperture having a second long axis aligned parallel to the first long axis, wherein the extraction aperture comprises a first height along a short axis perpendicular to the first long axis, and wherein the ground plate aperture comprises a second height along the short axis less than the first height.

10. The processing apparatus of claim 8, wherein the substrate stage defines a substrate plane lying parallel to the extraction plate, wherein a separation between the substrate plane and the extraction plate is less than 1 cm.

11. The processing apparatus of claim 8 wherein the ground plate defines a ground plane lying parallel to the extraction plate, wherein a separation between the ground plane and the extraction plate is less than 1 cm.

12. The processing apparatus of claim 11, wherein the substrate stage is movable along a direction perpendicular to the ground plane, wherein a second separation between the substrate stage and the extraction plane is greater than 1 cm.

13. The processing apparatus of claim 8, the RF generator comprising a circuit generating an RF voltage signal at the extraction plate having a frequency of 2 MHz to 60 MHz, the RF voltage signal comprising a waveform having a positive portion and a negative portion, wherein electrons are extracted through the extraction aperture and directed to the substrate stage during the negative portion.

\* \* \* \* \*